(12) United States Patent
Kim et al.

(10) Patent No.: US 12,276,025 B2
(45) Date of Patent: Apr. 15, 2025

(54) SUBSTRATE PROCESSING APPARATUS AND SUBSTRATE PROCESSING METHOD

(71) Applicant: SEMES CO., LTD., Chungcheongnam-do (KR)

(72) Inventors: Kwang Ryul Kim, Chungcheongnam-do (KR); Yun Sang Kim, Chungcheongnam-do (KR); Jin Hee Hong, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 194 days.

(21) Appl. No.: 18/092,169

(22) Filed: Dec. 30, 2022

(65) Prior Publication Data

US 2024/0003011 A1 Jan. 4, 2024

(30) Foreign Application Priority Data

Jul. 4, 2022 (KR) .................. 10-2022-0081709

(51) Int. Cl.
*C23C 16/46* (2006.01)
*C23C 16/455* (2006.01)
*H01J 37/32* (2006.01)

(52) U.S. Cl.
CPC ........ *C23C 16/46* (2013.01); *C23C 16/45544* (2013.01); *H01J 37/3244* (2013.01); *H01J 37/32458* (2013.01); *H01J 37/32724* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 11,664,238 B1 | * | 5/2023 | Shul | H01L 21/32115 438/720 |
| 2008/0233757 A1 | * | 9/2008 | Honda | H01J 37/32165 438/711 |
| 2013/0243971 A1 | * | 9/2013 | Thompson | C23C 16/45548 118/723 R |
| 2020/0006682 A1 | * | 1/2020 | Seo | H10K 77/111 |

(Continued)

FOREIGN PATENT DOCUMENTS

KR 10-2009-0013515 2/2009
KR 10-1702869 2/2017

(Continued)

OTHER PUBLICATIONS

Office action from the corresponding Korean Patent Application No. 10-2022-0081709 dated Apr. 30, 2024 with English translation from Global Dossier.

*Primary Examiner* — Alexander M Weddle
(74) *Attorney, Agent, or Firm* — WOMBLE BOND DICKINSON (US) LLP

(57) ABSTRACT

A substrate processing apparatus includes a processing chamber having a processing space in which a substrate is plasma-processed, and having a transparent window; a gas flow unit supplying and discharging process gas to the processing chamber; and a laser irradiator irradiating a laser for heating the substrate to be selectively atomic layer-processed for each of a plurality of thin films formed on the substrate through the transparent window from an external space of the processing chamber.

20 Claims, 9 Drawing Sheets

(56) References Cited

U.S. PATENT DOCUMENTS

| | | | |
|---|---|---|---|
| 2021/0043477 A1 | 2/2021 | Kawarazaki et al. | |
| 2021/0104414 A1* | 4/2021 | Panagopoulos | H01L 21/67115 |
| 2022/0285139 A1 | 9/2022 | Park et al. | |
| 2023/0002905 A1* | 1/2023 | Teo | C23C 16/45561 |

FOREIGN PATENT DOCUMENTS

| | | | |
|---|---|---|---|
| KR | 10-2021-0018116 A | 2/2021 | |
| KR | 10-2022-0088621 A | 6/2022 | |
| WO | WO-2021089424 A1 * | 5/2021 | C23C 16/26 |

* cited by examiner

[FIG. 1]
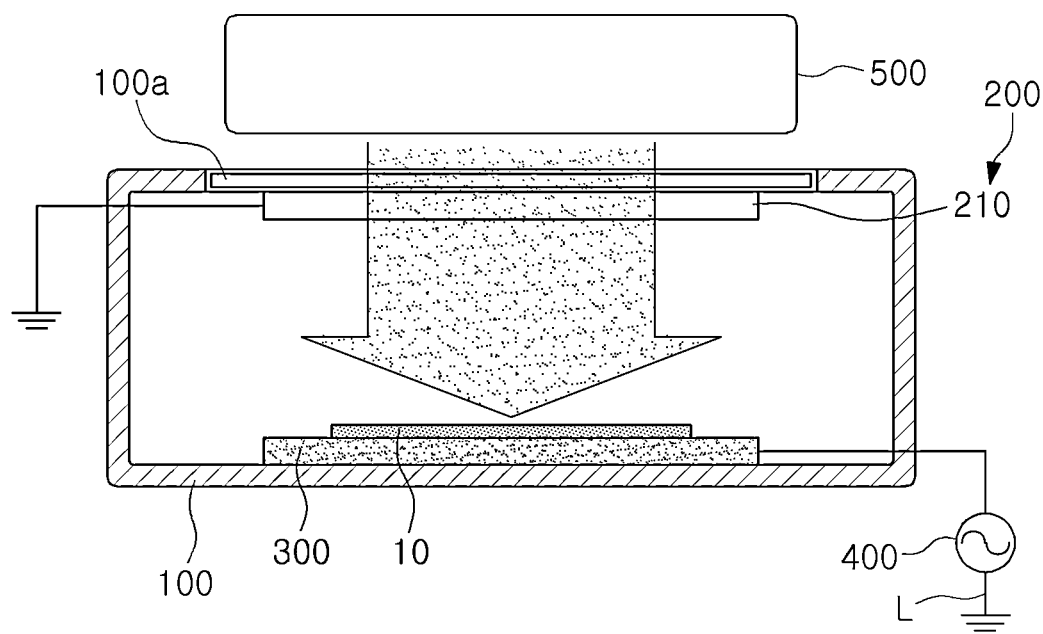

[FIG. 2]
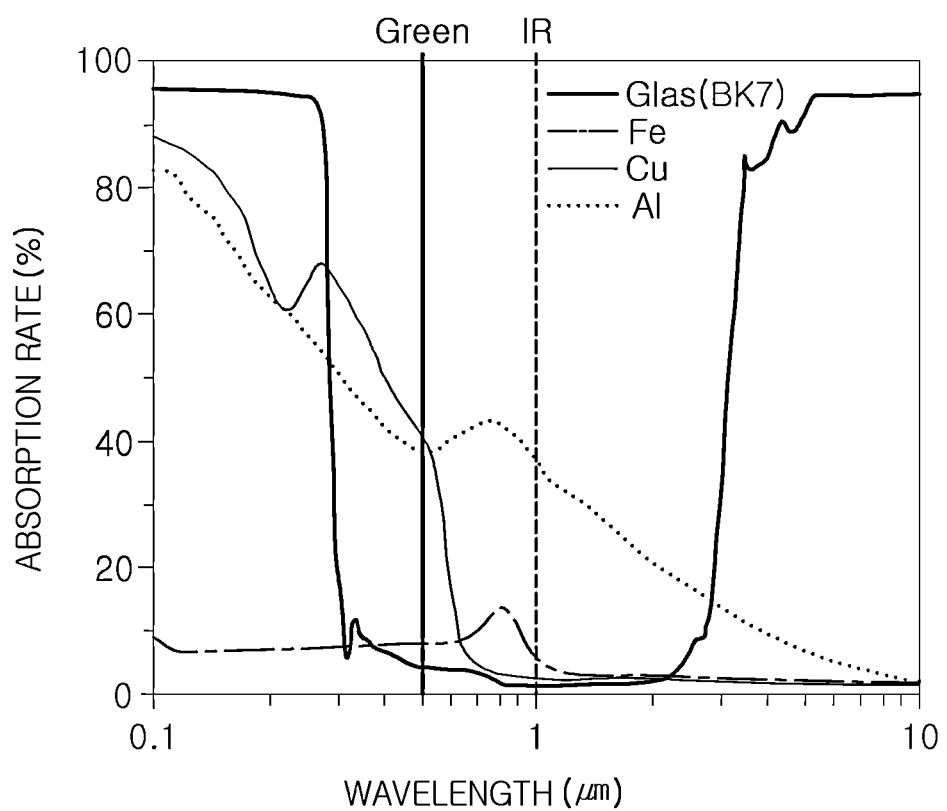

[FIG. 3]
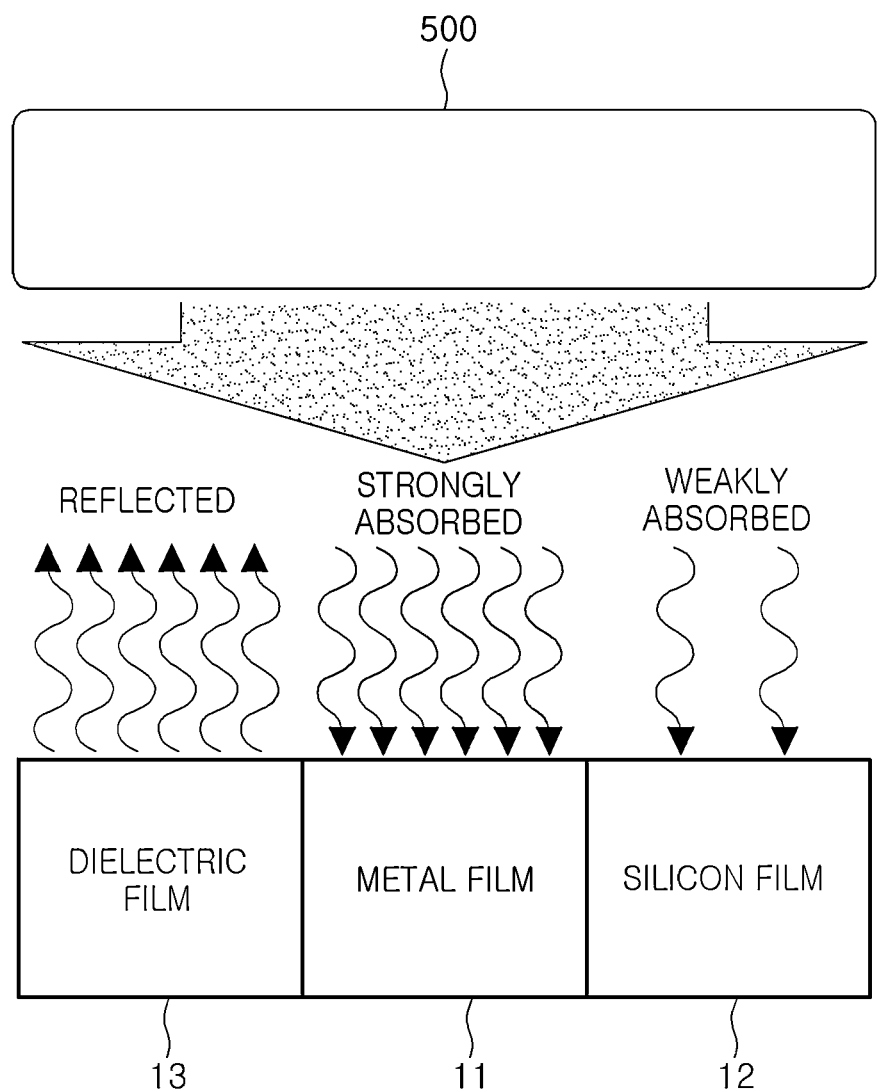

[FIG. 4]
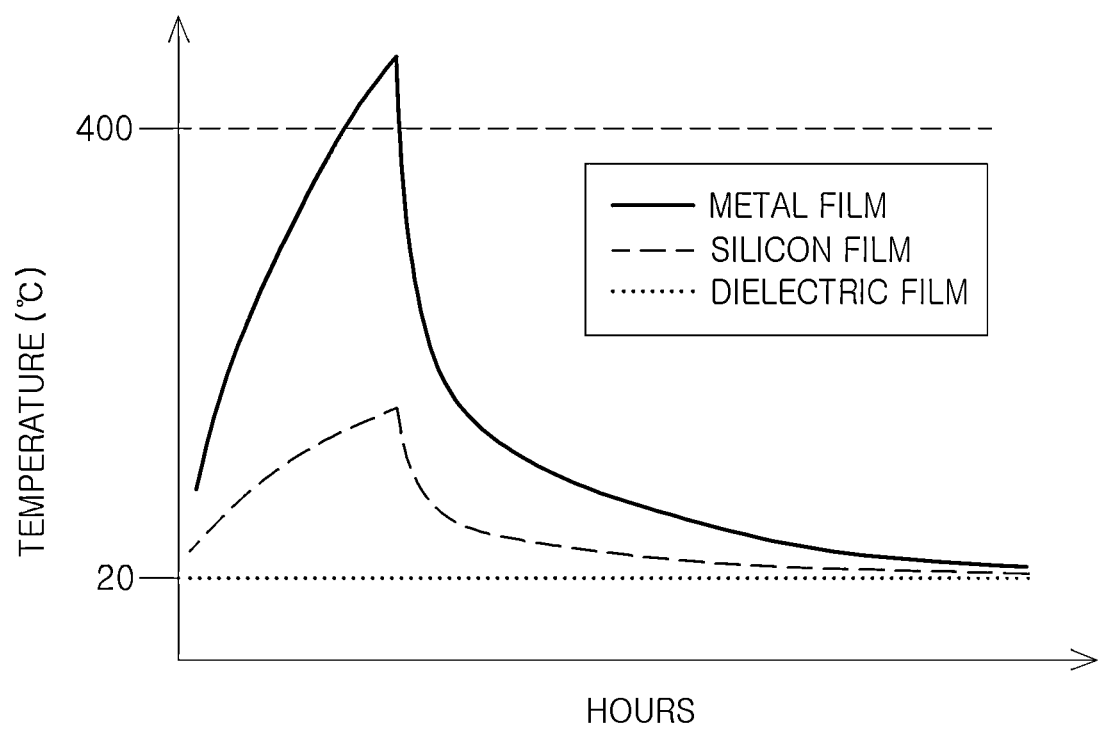

[FIG. 5]
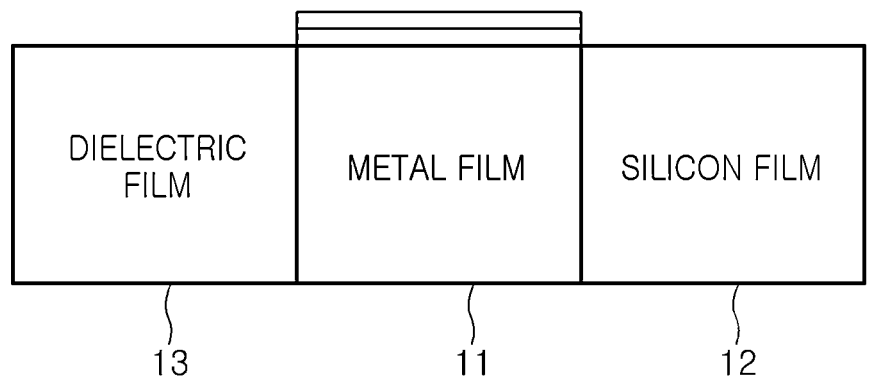
[FIG. 6]
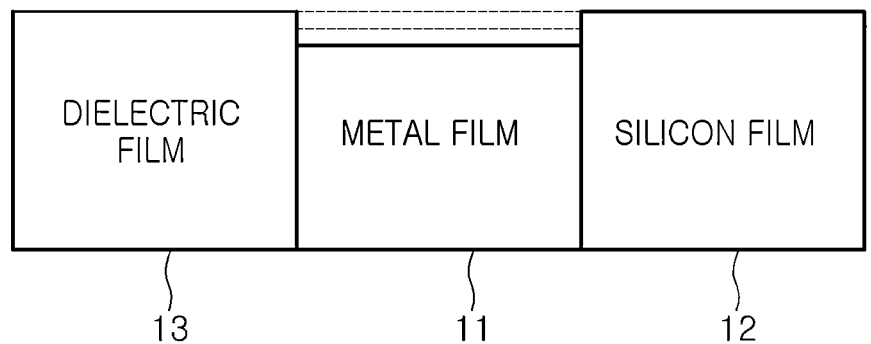

[FIG. 7]
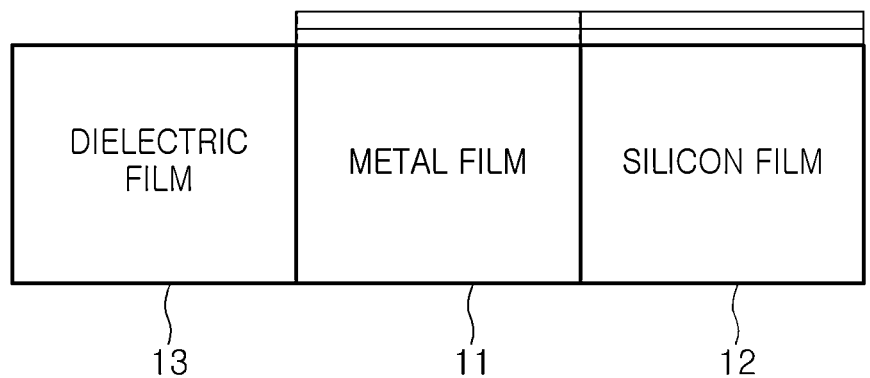
[FIG. 8]
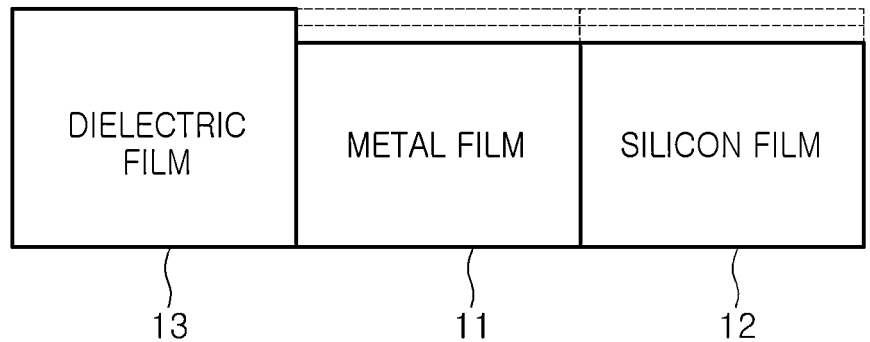

[FIG. 9]
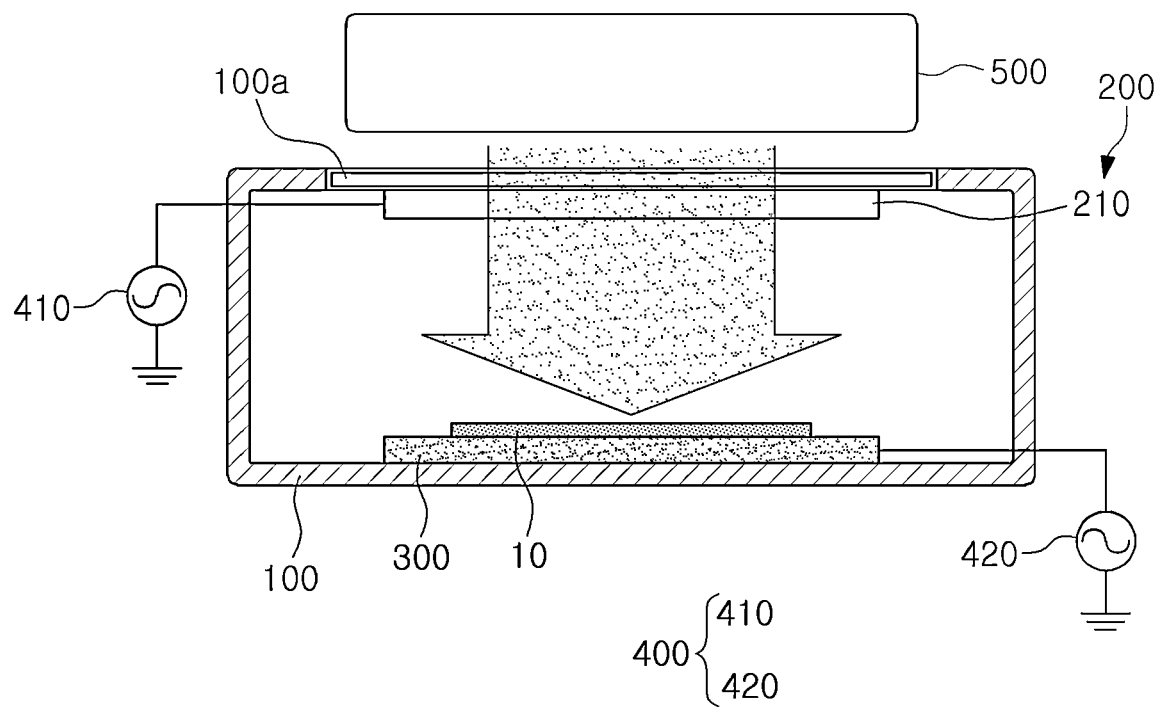

[FIG. 10]
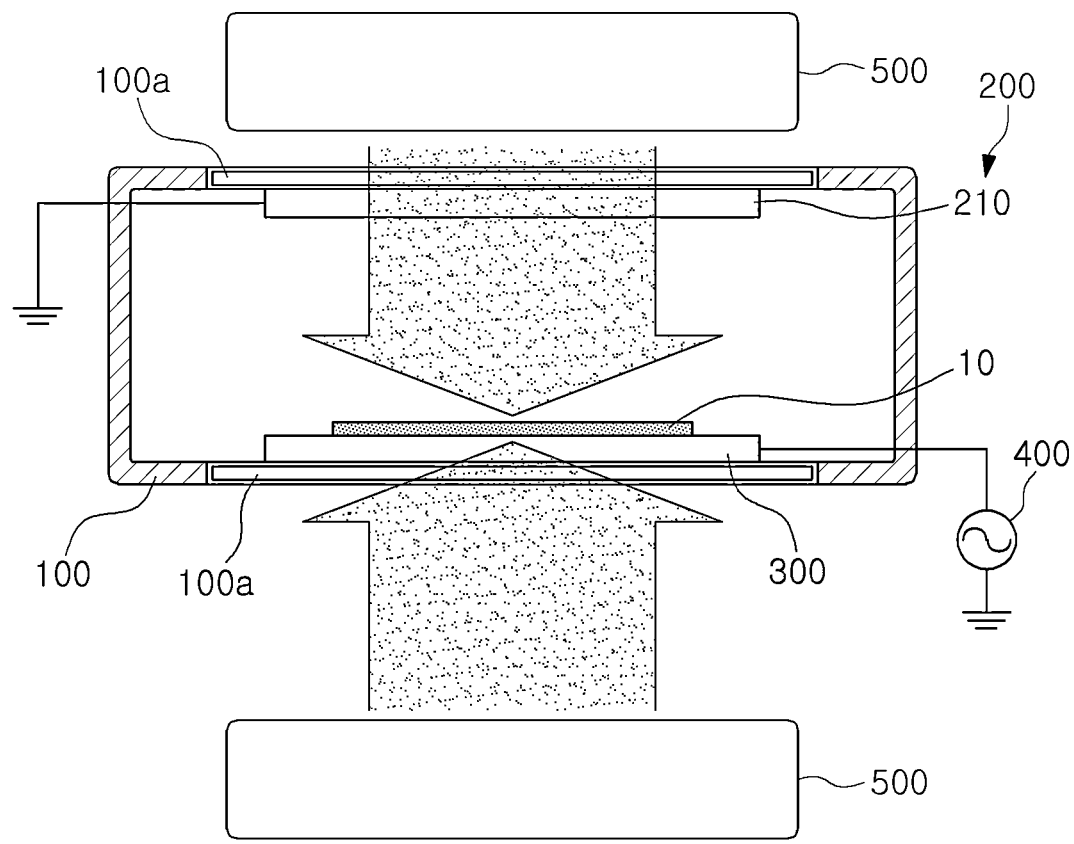

[FIG. 11]
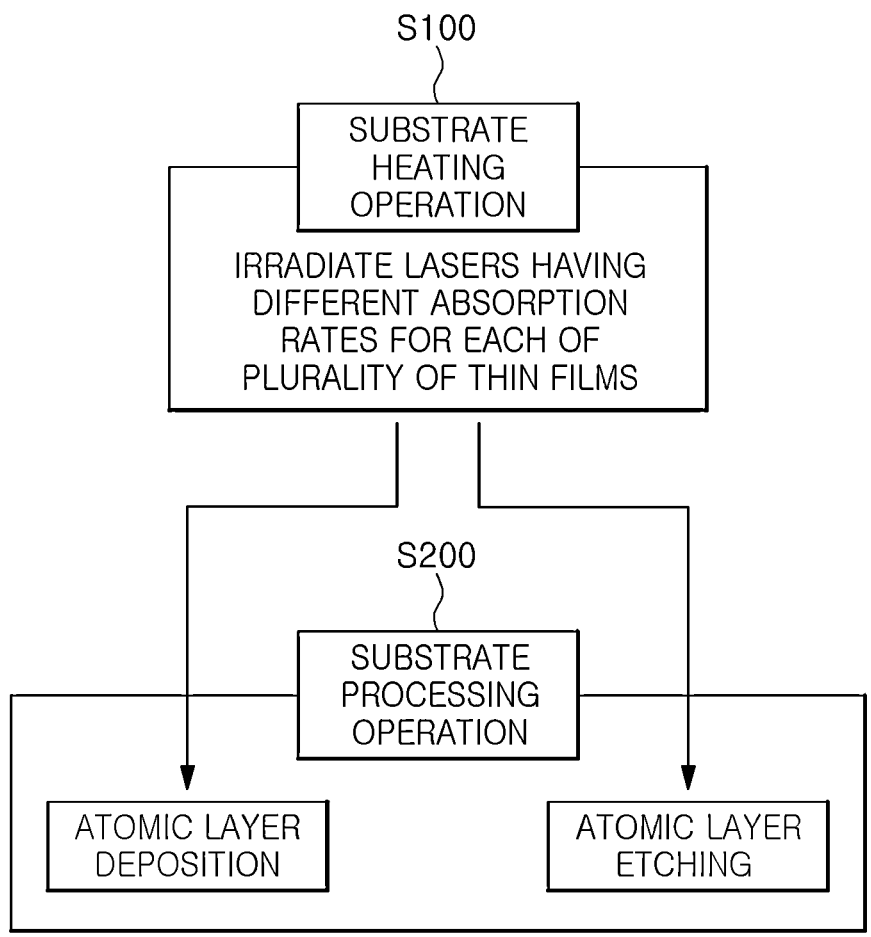

SUBSTRATE PROCESSING APPARATUS AND SUBSTRATE PROCESSING METHOD

CROSS-REFERENCE TO RELATED APPLICATION(S)

This application claims benefit of priority to Korean Patent Application No. 10-2022-0081709 filed on Jul. 4, 2022 in the Korean Intellectual Property Office, the disclosure of which is incorporated herein by reference in its entirety.

BACKGROUND

1. Field

The present disclosure relates to a substrate processing apparatus and a substrate processing method, for processing a substrate.

2. Description of Related Art

Due to the development of semiconductor integration technology, an operation of depositing a high-purity and high-quality thin film has played an important role in a semiconductor manufacturing process. Representative methods of thin film formation may include a chemical vapor deposition (CVD) process and a physical vapor deposition (PVD) process. At this time, the physical vapor deposition process may not be used to form a film of a uniform thickness on an uneven surface, due to deterioration in step coverage of a formed thin film. The chemical vapor deposition process may be a process in which a reaction of gaseous substances is generated on a surface of a heated substrate, and a compound produced by the reaction may be deposited on the surface of the substrate. Compared to the physical vapor deposition process, the chemical vapor deposition process has been widely applied, because the chemical vapor deposition process has good step coverage, may cause less damage to a substrate on which a thin film is deposited, has lower costs for depositing a thin film, and allows a mass-production of the thin film.

However, as a degree of integration of semiconductor devices has recently improved to sub-micron units, there may be limits in obtaining a uniform thickness of sub-micron units or excellent step coverage in a wafer substrate only by the conventional chemical vapor deposition process. It has been difficult to obtain a material film having a constant composition regardless of location, when there is a step difference such as a contact hole, a via, or a trench, having a sub-micron-size, in the wafer substrate.

Therefore, unlike the conventional chemical vapor deposition process in which all process gases are simultaneously injected, an atomic layer deposition (ALD) process in which two or more process gases necessary to obtain a desired thin film are sequentially and separately supplied over time, so as not to meet in gas phases, but supply cycles thereof are periodically repeated to form a thin film, may be applied as a new method of forming a thin film.

In addition, in a process of manufacturing a semiconductor device, an etching process may be a process of selectively removing a target material to form a desired structure. As an example, an atomic layer etching (ALE) process has been researched to remove a target material in a desired amount (thickness). Such an atomic layer etching process may be a process of repeating a cycle set in operations of modifying a surface of the target material and removing the modified surface. Furthermore, the atomic layer etching process may be actively applied in a process of manufacturing a semiconductor device, which may be increasingly miniaturized, because control on an atomic level is possible in removing a target material.

Meanwhile, a mask may be used for atomic layer-processing (atomic layer deposition or atomic layer etching) on a selected thin film among a plurality of thin films formed on a substrate. That is, in the prior art, there may be a limitation in that a mask is required for atomic layer-processing of only some thin films selectively among a plurality of thin films.

(Patent Document 1) Korea Patent No. 10-1702869

SUMMARY

The present disclosure has been devised to solve the above limitations, and an object of the present disclosure is to provide a substrate processing apparatus and a substrate processing method, selectively performing atomic layer-processing for a plurality of thin films without a mask.

In order to achieve the above object, a substrate processing apparatus according to the present disclosure includes a processing chamber having a processing space in which a substrate is plasma-processed, and having a transparent window; a gas flow unit supplying and discharging process gas to the processing chamber; and a laser irradiator irradiating a laser for heating the substrate to be selectively atomic layer-processed for each of a plurality of thin films formed on the substrate through the transparent window from an external space of the processing chamber.

The laser irradiator may irradiate lasers having different absorption rates for each of the plurality of thin films.

The plurality of thin films may include a metal film, a silicon film, and a dielectric film, and the laser may have a higher absorption rate in order of the metal film, the silicon film, and the dielectric film.

The laser irradiator may be an ultraviolet laser oscillator or a visible light laser oscillator.

The gas flow unit may include a gas feed installed in the processing chamber and supplying the process gas; and a gas ejector formed on one side of the processing chamber or on one side of the gas feed.

The laser irradiator may be disposed above the processing chamber, the transparent window may be formed in an upper portion of the processing chamber, and the gas feed may be disposed in the processing chamber, may function as an electrode for plasma generation, may be disposed between the transparent window in the upper portion of the processing chamber and the substrate, and may be formed of a transparent material.

The present disclosure may further include a substrate support disposed in the processing chamber to support the substrate and functioning as an electrode for plasma generation, wherein the laser irradiator may be disposed above and below the processing chamber, and the transparent window may be formed in the upper portion and a lower portion of the processing chamber, wherein the substrate support may be disposed between the transparent window in the lower portion of the processing chamber and the substrate, and may be formed of a transparent material.

According to another aspect of the present disclosure, a substrate processing apparatus includes a processing chamber having a processing space in which a substrate is plasma-processed, and having a transparent window; a gas feed disposed in the processing chamber to supply a process gas, and functioning as an upper electrode for plasma generation; a gas ejector formed on one side of the processing chamber or one side of the gas feed; a substrate support disposed in the processing chamber, supporting the substrate, and functioning as a lower electrode for plasma generation; a power source connected to each of the gas feed and the substrate support; and a laser irradiator irradiating a laser for heating the substrate to be selectively atomic layer-processed for each of a plurality of thin films formed on the substrate through the transparent window from an external space of the processing chamber.

The power source may include a first power source member applying first power to the gas feed; and a second power source member applying second power having a frequency, lower than a frequency of the first power to the substrate support.

According to another aspect of the present disclosure, a substrate processing method includes a substrate heating operation of irradiating a laser for heating a substrate to be selectively atomic layer-processed for each of a plurality of thin films formed on the substrate through a transparent window of a processing chamber from an external space of the processing chamber; and a substrate processing operation of selectively atomic layer-processing each of the plurality of thin films.

In the substrate heating operation, lasers having different absorption rates for each of the plurality of thin films may be irradiated to the substrate.

In the substrate heating operation, an ultraviolet laser or a visible light laser may be irradiated to the substrate.

In the substrate heating operation, a laser having a higher absorption rate in order of a metal film, a silicon film, and a dielectric film, among the plurality of thin films, may be used.

In the substrate processing operation, atomic layer deposition (ALD) may be selectively performed for each of the plurality of thin films.

In the substrate processing operation, atomic layer etching (ALE) may be selectively performed for each of the plurality of thin films.

BRIEF DESCRIPTION OF DRAWINGS

The above and other aspects, features, and advantages of the present disclosure will be more clearly understood from the following detailed description, taken in conjunction with the accompanying drawings, in which:

FIG. 1 is a view illustrating a substrate processing apparatus according to a first embodiment of the present disclosure.

FIG. 2 is a graph illustrating an absorption rate according to a type of laser for a substrate.

FIG. 3 is a view illustrating a laser irradiated from the substrate processing apparatus of FIG. 1 being absorbed or reflected by a plurality of thin films formed on a substrate.

FIG. 4 is a graph illustrating a surface temperature for each of the plurality of thin films of FIG. 3.

FIG. 5 is a view illustrating that atomic layer deposition is selectively performed only on a metal film among a plurality of thin films by the surface temperature of FIG. 4.

FIG. 6 is a view illustrating that atomic layer etching is selectively performed only on a metal film among a plurality of thin films by the surface temperature of FIG. 4.

FIG. 7 is a view illustrating that atomic layer deposition is selectively performed on only a metal film and a silicon film, among a plurality of thin films.

FIG. 8 is a view illustrating that atomic layer etching is selectively performed on only a metal film and a silicon film among a plurality of thin films.

FIG. 9 is a view illustrating a substrate processing apparatus according to a second embodiment of the present disclosure.

FIG. 10 is a view illustrating a substrate processing apparatus according to a third embodiment of the present disclosure.

FIG. 11 is a view illustrating a substrate processing method according to an embodiment of the present disclosure.

DETAILED DESCRIPTION

Hereinafter, preferred embodiments will be described in detail such that those of ordinary skill in the art easily practices the present disclosure with reference to the accompanying drawings. However, in describing a preferred embodiment of the present disclosure in detail, if it is determined that a detailed description of a related known function or configuration unnecessarily obscures the gist of the present disclosure, the detailed description thereof will be omitted. In addition, the same reference numerals may be used throughout the drawings for parts having similar functions and operations. In addition, in this specification, terms such as 'on,' 'upper portion,' 'upper surface,' 'below,' 'lower portion,' 'lower surface,' 'side surface,' and the like may be based on the drawings, and in fact, may be changed depending on a direction in which components is disposed.

In addition, throughout the specification, when a portion is 'connected' to another portion, may include not only 'directly connected.' but also 'indirectly connected' to other components interposed therebetween. In addition, 'including' a certain component means that other components are further included, rather than excluding other components, unless otherwise stated.

FIG. 1 is a view illustrating a substrate processing apparatus according to a first embodiment of the present disclosure.

Referring to the drawings, a substrate processing apparatus according to the present disclosure may include a processing chamber 100, a gas flow unit 200, a substrate support 300, a power source 400, and a laser irradiator 500.

The processing chamber 100 may be a chamber having a processing space in which a substrate 10 is plasma-processed. As a representative example, the processing chamber 100 may be utilized in an atomic layer deposition (ALD) process in which the substrate 10 is deposited in units of atomic layers, or an atomic layer etching (ALE) process in which the substrate 10 is etched in units of atomic layers. Furthermore, the processing chamber 100 is not limited by the present disclosure, and may be utilized in a process including plasma processing while requiring a high temperature state of the substrate 10. Specifically, the processing chamber 100 may be utilized as a capacitively coupled plasma (CCP) chamber, and may further be utilized as a transparent capacitively coupled plasma (TCCP) chamber having a transparent window 100a.

The processing chamber 100 may include a transparent window 100a through which a laser irradiated from the laser irradiator 500 passes. In a structure in which the laser irradiator 500 is disposed outside the processing chamber 100, a portion of the processing chamber 100 may be replaced with the transparent window. 100a such that the laser irradiated from the laser irradiator 500 passes through the processing chamber 100.

The gas flow unit 200 may supply and discharge a process gas. The gas flow unit 200 may have a structure for supplying and discharging a process gas for atomic layer-processing of the substrate 10.

The gas flow unit 200 may include a gas feed 210 and a gas ejector.

The gas feed 210 may be disposed in the processing chamber 100, and may supply a process gas to the processing chamber 100. As an example, the gas feed 210 may supply a process gas to the processing chamber 100 for atomic layer deposition or atomic layer etching. In an atomic layer deposition process, the process gas may include a source gas (precursor), a reaction gas, and a purge gas. In this case, the gas feed 210 may be connected to a source gas feeding tank, a reaction gas feeding tank, and a purge gas feeding tank. In addition, in an atomic layer etching process, the process gas may include a source gas (precursor), an etching gas, and a purge gas. In this case, the gas feed 210 may be connected to a source gas feeding tank, an etching gas feeding tank, and a purge gas feeding tank. In the gas feed 210, a gas feeding hole (not illustrated) for supplying the process gas into the processing chamber 100 may be formed. Although not illustrated in the drawing, the gas ejector may be formed on one side of the processing chamber 100 or one side of the gas feed 210, to discharge the process gas supplied by the gas feed 210. For example, the gas ejector may be connected to one side of the processing chamber 100, or may include a gas ejecting hole (not illustrated) formed on one side of the gas feed 210, and the process gas may be discharged through the gas ejecting hole.

The substrate support 300 may be disposed in the processing chamber 100, and may support the substrate 10.

The above-described gas feed 210 may function as an upper electrode for plasma generation, and the substrate support 300 may function as a lower electrode for plasma generation. For example, the gas feed 210 and the substrate support 300 may be used as electrodes, to convert the process gas supplied to the processing chamber 100 into a plasma state.

The power source 400 may be installed on a power line connected to the substrate support 300. The power source 400 may form a plasma by applying a high-frequency power to the substrate support 300 to apply an electric field in the processing chamber 100. Furthermore, a capacitor (not illustrated) may be installed between the substrate support 300 and the power source portion 400 on the power line L, to form self DC bias toward the substrate support 300, which may be the lower electrode. As the capacitor, e.g., a blocking capacitor, traps (accumulates) passing electrons to become a negative voltage, positive ions of the plasma may be accelerated to the substrate 10 to improve deposition or etching.

The laser irradiator 500 may be disposed outside the processing chamber 100, and may irradiate a laser to the substrate 10 through the transparent window 100a of the processing chamber 100.

Specifically, the laser irradiator 500 may be disposed above the processing chamber 100, and the transparent window 100a may be formed in an upper portion of the processing chamber 100. The laser of the laser irradiator 500 disposed above the processing chamber 100 may be irradiated onto an upper surface of the substrate 10 through the transparent window 100a formed in the upper portion of the processing chamber 100.

In this case, the gas feed 210 may be disposed between the transparent window 100a in the upper portion of the processing chamber 100 and the substrate 10. The gas feed 210 may be formed of a transparent material to allow the laser to pass therethrough. For this reason, the laser irradiated from the laser irradiator 500 may sequentially pass through the transparent window 100a and the transparent gas feed 210, in the upper portion of the processing chamber 100, and may be irradiated to the substrate 10.

The laser irradiated by the laser irradiator 500 may serve to heat the substrate 10 to be selectively atomic layer-processed for each of a plurality of thin films formed on the substrate 10. A detailed look at such a laser may be as follows.

FIG. 2 is a graph illustrating an absorption rate according to a type of laser for a substrate.

Referring to the drawings, as an example, in a copper widely used in a semiconductor process, a laser absorption rate may be provided to be higher than a certain level at wavelengths corresponding to an ultraviolet laser and a visible light laser (including a green laser). An infrared laser having a relatively high wavelength may be hardly absorbed by the copper.

Based thereon, a laser irradiator (500 in FIG. 1) of the present disclosure may be a laser oscillator irradiating a laser having a good absorption rate to a metal used in a semiconductor. Specifically, the laser irradiator 500 may be an ultraviolet laser oscillator irradiating an ultraviolet laser, or a visible ray laser oscillator irradiating a visible ray laser.

For example, the ultraviolet laser or visible laser irradiated from the laser irradiator 500 may heat the substrate such that the atomic layer processing may be selectively performed for each of the plurality of thin films formed on the substrate. A detailed description thereof will be provided later.

FIG. 3 is a view illustrating a laser irradiated from the substrate processing apparatus of FIG. 1 being absorbed or reflected by a plurality of thin films formed on a substrate, and FIG. 4 is a graph illustrating a surface temperature for each of the plurality of thin films of FIG. 3.

In addition, FIG. 5 is a view illustrating that atomic layer deposition is selectively performed only on a metal film among a plurality of thin films by the surface temperature of FIG. 4, and FIG. 6 is a view illustrating that atomic layer etching is selectively performed only on a metal film among a plurality of thin films by the surface temperature of FIG. 4.

Referring to the drawings, a plurality of thin films may be formed on a substrate (10 of FIG. 1), and the plurality of thin films may have a structure exposed in an upward direction. In this case, a laser irradiator 500 may irradiate lasers having wavelengths having different absorption rates for each of the plurality of thin films.

Specifically, as illustrated in FIG. 3, the plurality of thin films may include a metal film 11, a silicon film 12, and a dielectric film 13. In this case, a laser may have wavelengths with larger characteristics in order of the metal film 11, the silicon film 12, and the dielectric film 13. As an example, lasers irradiated from the laser irradiator 500 may be strongly absorbed by the metal film 11, may be weakly absorbed by the silicon film 12, and may be reflected by the dielectric film 13, such that absorption may not occur.

When such a laser is irradiated to the substrate 10 for a certain period of time as an embodiment, as illustrated in FIG. 4, a surface temperature of the metal film may rise to 400° C. or higher, which may be an appropriate temperature for a process, and a surface temperature of the silicon film and a surface temperature of the dielectric film may not reach 400° C., which may be the appropriate temperature for the process. Therefore, as an example, as illustrated in FIG. 5, among the plurality of thin films, atomic layer deposition may be selectively performed only on the metal film 11, whereas atomic layer deposition may not be performed on the silicon film 12 and the dielectric film 13. As another example, as illustrated in FIG. 6, among the plurality of thin films, atomic layer etching may be selectively performed only on the metal layer 11, whereas the atomic layer etching may not be performed on the silicon layer 12 and the dielectric layer 13.

FIG. 7 is a view illustrating that atomic layer deposition is selectively performed on only a metal film and a silicon film, among a plurality of thin films, and FIG. 8 is a view illustrating that atomic layer etching is selectively performed on only a metal film and a silicon film among a plurality of thin films.

As another embodiment, a laser may be irradiated to the substrate fora longer period of time, or a laser having a higher absorption rate even in a silicon film than in the above embodiment may be irradiated to the substrate. In this case, although not illustrated in the drawings, a surface temperature of a metal film and a surface temperature of a silicon film may rise to 400° C. or higher, which may be an appropriate process temperature, and a surface temperature of a dielectric film may not reach 400° C., an appropriate process temperature. Therefore, as an example, as illustrated in FIG. 7, among a plurality of thin films, atomic layer deposition may be selectively performed on only the metal film 11 and the silicon film 12, whereas the atomic layer deposition may not be performed on the dielectric film 13. In addition, as another example, as illustrated in FIG. 8, among the plurality of thin films, atomic layer etching may be selectively performed on only the metal film 11 and the silicon film 12, whereas the atomic layer etching may not be performed on the dielectric film 13.

FIG. 9 is a view illustrating a substrate processing apparatus according to a second embodiment of the present disclosure.

Referring to the drawings, a substrate processing apparatus according to a second embodiment of the present disclosure may have two power sources members 410 and 420 such that a power source 400 uses a dual frequency, as compared to the substrate processing apparatus according to the first embodiment described above.

Specifically, the power source 400 may include two power source members 410 and 420 having different frequencies. For example, the power source 400 may include power source members 410 and 420, connected to a gas feed 210 and a substrate support 300, respectively. For example, the power source 400 may include a first power source member 410 and a second power source member 420. The first power member 410 may apply a first power to the gas feed 210. The second power member 420 may apply a second power to the substrate support 300. In this case, the second power may have a frequency, lower than a frequency of the first power. For example, the frequency of the first power may be relatively higher than the frequency of the second power, and a plasma may be easily controlled by such a high frequency. In addition, the frequency of the second power may be relatively lower than the frequency of the first power, an ion energy of a cathode sheath may be easily controlled by such a low frequency. As described above, the present disclosure may include the two power source members 410 and 420 to use a dual frequency, smoothly control a plasma and an ion energy.

Since a gas flow unit 200 including a gas feed 210 and a gas ejector, a substrate support 300, and a laser irradiator 500 have been described above in the first embodiment of FIG. 1, a detailed description thereof will be omitted.

FIG. 10 is a view illustrating a substrate processing apparatus according to a third embodiment of the present disclosure.

Referring to the drawings, in a substrate processing apparatus according to a third embodiment of the present disclosure, a laser irradiator 500 may be additionally disposed below a processing chamber 100, as compared to the substrate processing apparatus according to the first embodiment described above.

Specifically, a laser irradiator 500 may be disposed above and below the processing chamber 100, respectively. The laser irradiator 500 disposed above the processing chamber 100 may irradiate a laser onto an upper surface of a substrate 10. The laser irradiator 500 disposed below the processing chamber 100 may irradiate a laser onto a lower surface of the substrate Therefore, a temperature of the substrate 10 may be raised to an appropriate process temperature in a shorter time.

Upper and lower portions of the processing chamber 100 may be formed of a transparent window 100a, respectively, such that the laser irradiated from the laser irradiator 500 passes. For example, one transparent window 100a may be formed in the upper portion of the processing chamber 100, to irradiate the laser of the laser irradiator 500 disposed above the processing chamber 100 onto the upper surface of the substrate 10 through the transparent window 100a. And, a different transparent window 100a may be formed in the lower portion of the processing chamber 100, to irradiate the laser of the laser irradiator 500 disposed below the processing chamber 100 onto the lower surface of the substrate 10 through the transparent window 100a.

In this case, the substrate support 300 disposed between the transparent window 100a in the lower portion of the processing chamber 100 and the substrate 10 may be formed of a transparent material, such that the laser passing through the transparent window 100a passes.

Since a gas flow unit 200 including a gas feed 210 and a gas ejector, a substrate support 300, and a laser irradiator 500 have been described above in the first embodiment of FIG. 1, a detailed description thereof will be omitted.

FIG. 11 is a view illustrating a substrate processing method according to an embodiment of the present disclosure.

Referring to the drawings, a substrate processing method according to the present disclosure may include a substrate heating operation (S100) and a substrate processing operation (S200).

The substrate heating operation (S100) may be an operation of irradiating a substrate with a laser heating the substrate such that a plurality of thin films formed on the substrate is selectively atomic layer-processed. In this case, the laser may be irradiated to the substrate through a transparent window of a processing chamber from an external space of the processing chamber.

Specifically, in the substrate heating operation (S100), lasers having different absorption rates for each of the plurality of thin films may be irradiated onto the substrate. In the substrate heating operation (S100), the laser may be a laser within a wavelength range corresponding to an ultraviolet laser and a visible light laser, and in the substrate heating operation (S100), the ultraviolet laser or the visible light laser may be irradiated to the substrate.

More specifically, in the substrate heating operation (S100), a laser having a higher absorption rate in order of a metal film, a silicon film, and a dielectric film, among the plurality of thin films, may be used. As an example, the laser irradiated in the substrate heating operation (S100) may be strongly absorbed by the metal film, may be weakly absorbed by the silicon film, and may be reflected by the dielectric film, such that almost no absorption may occur.

The substrate processing operation (S200) may be an operation of selectively atomic layer-processing each of the plurality of thin films. Specifically, in the substrate processing operation (S200), the substrate may be heated by lasers having different absorption rates for each of the plurality of thin films in the substrate heating operation (S100), such that the atomic layer-processing is selectively performed for each of the plurality of thin films. As an example, in the substrate processing operation (S200), atomic layer deposition (ALD) may be selectively performed for each of the plurality of thin films in the substrate. As another example, in the substrate processing operation (S200), atomic layer etching (ALE) may be selectively performed for each of a plurality of thin films.

The present disclosure may be configured to heat a substrate by irradiating lasers having different absorption rates for each of a plurality of thin films formed on the substrate, to have an effect of selectively performing atomic layer-processing for each of the plurality of thin films without using a mask.

While example embodiments have been illustrated and described above, it will be apparent to those skilled in the art that modifications and variations could be made without departing from the scope of the present disclosure as defined by the appended claims.

What is claimed is:

1. A substrate processing apparatus comprising:
   a processing chamber having a processing space in which a substrate is plasma-processed, and having a transparent window;
   a gas flow unit supplying and discharging process gas to the processing chamber, wherein the gas flow unit comprises a gas feed having a transparent material and disposed between the transparent window and the substrate; and
   a laser irradiator irradiating a laser for heating the substrate to be selectively atomic layer-processed for each of a plurality of thin films formed on the substrate through the transparent window from an external space of the processing chamber.

2. The substrate processing apparatus of claim 1, wherein the laser irradiator irradiates the laser having different absorption rates for each of the plurality of thin films having different materials.

3. The substrate processing apparatus of claim 2, wherein the plurality of thin films comprise a metal film, a silicon film, and a dielectric film, and
   the laser has higher absorption rates in order of the metal film, the silicon film, and the dielectric film.

4. The substrate processing apparatus of claim 2, wherein the laser irradiator is an ultraviolet laser oscillator or a visible light laser oscillator.

5. The substrate processing apparatus of claim 2, wherein:
   the gas feed is installed in the processing chamber and configured to supply the process gas; and
   the gas flow unit further comprises a gas ejector formed on one side of the processing chamber or one side of the gas feed.

6. The substrate processing apparatus of claim 5, wherein the laser irradiator is disposed above the processing chamber,
   the transparent window is formed in an upper portion of the processing chamber, and
   the gas feed is disposed in the processing chamber, functions as an electrode for plasma generation.

7. The substrate processing apparatus of claim 6, further comprising a substrate support disposed in the processing chamber to support the substrate and functioning as an electrode for plasma generation,
   wherein the laser irradiator is disposed above the processing chamber and another laser irradiator is disposed below the processing chamber, and
   the transparent window is formed in the upper portion of the processing chamber and another transparent window is formed in a lower portion of the processing chamber,
   wherein the substrate support is disposed between the transparent window in the lower portion of the processing chamber and the substrate, and is formed of a transparent material.

8. A substrate processing apparatus comprising:
   a processing chamber having a processing space in which a substrate is plasma-processed, and having a transparent window;
   a gas feed having a transparent material and disposed between the transparent window and the substrate in the processing chamber to supply a process gas, and functioning as an upper electrode for plasma generation;
   a gas ejector formed on one side of the processing chamber or one side of the gas feed;
   a substrate support disposed in the processing chamber, supporting the substrate, and functioning as a lower electrode for plasma generation;
   a power source connected to each of the gas feed and the substrate support; and
   a laser irradiator irradiating a laser for heating the substrate to be selectively atomic layer-processed for each of a plurality of thin films formed on the substrate through the transparent window from an external space of the processing chamber.

9. The substrate processing apparatus of claim 8, wherein the laser irradiator irradiates the laser having different absorption rates for each of the plurality of thin films having different materials.

10. The substrate processing apparatus of claim 9, wherein the plurality of thin films comprise a metal film, a silicon film, and a dielectric film, and the laser has higher absorption rates in order of the metal film, the silicon film, and the dielectric film.

11. The substrate processing apparatus of claim 9, wherein the laser irradiator is an ultraviolet laser oscillator or a visible light laser oscillator.

12. The substrate processing apparatus of claim 8, wherein the laser irradiator is disposed above the processing chamber, the transparent window is formed in an upper portion of the processing chamber.

13. The substrate processing apparatus of claim 12, wherein the laser irradiator is disposed above the processing chamber and another laser irradiator is disposed below the processing chamber, and
   the transparent window is formed in the upper portion of the processing chamber and another transparent window is formed in a lower portion of the processing chamber,
   wherein the substrate support is disposed between the transparent window in the lower portion of the processing chamber and the substrate, and is formed of a transparent material.

14. The substrate processing apparatus of claim 8, wherein the power source comprises:
   a first power source member applying first power to the gas feed; and
   a second power source member applying second power having a frequency, lower than a frequency of the first power, to the substrate support.

15. A substrate processing method comprising:
   irradiating a laser for heating a substrate to be selectively atomic layer-processed for each of a plurality of thin films formed on the substrate through a transparent window of a processing chamber from an external space of the processing chamber;
   supplying and discharging, by a gas flow unit comprising a gas feed, process gas to the processing chamber, wherein the gas feed has a transparent material and is disposed between the transparent window and the substrate; and
   selectively atomic layer-processing each of the plurality of thin films.

16. The method of claim 15, wherein the irradiating of the laser comprises irradiating the laser having different absorption rates for each of the plurality of thin films having different materials.

17. The method of claim 16, wherein the irradiating of the laser comprises irradiating an ultraviolet laser or a visible light laser to the substrate.

18. The method of claim 16, wherein the laser has higher absorption rates in order of the metal film, the silicon film, and the dielectric film.

19. The method of claim 16, wherein the selectively atomic layer-processing of each of the plurality of thin films comprises selectively performing atomic layer deposition (ALD) for each of the plurality of thin films.

20. The method of claim 16, wherein the selectively atomic layer-processing of each of the plurality of thin films comprises selectively performing atomic layer etching (ALE) for each of the plurality of thin films.

* * * * *